United States Patent
Tada et al.

(10) Patent No.: US 7,304,248 B2
(45) Date of Patent: Dec. 4, 2007

(54) MULTI-LAYER PRINTED CIRCUIT BOARD AND METHOD FOR MANUFACTURING THE SAME

(75) Inventors: Kazuo Tada, Kariya (JP); Koji Kondo, Toyohashi (JP); Satoshi Takeuchi, Nagoya (JP)

(73) Assignee: DENSO CORPORATION, Kariya (JP)

( * ) Notice: Subject to any disclaimer, the term of this patent is extended or adjusted under 35 U.S.C. 154(b) by 297 days.

(21) Appl. No.: 10/814,803

(22) Filed: Apr. 1, 2004

(65) Prior Publication Data

US 2005/0139386 A1 Jun. 30, 2005

(30) Foreign Application Priority Data

Apr. 4, 2003 (JP) ............... 2003-101461

(51) Int. Cl.
H05K 1/16 (2006.01)
(52) U.S. Cl. .................. 174/260; 361/761; 361/762
(58) Field of Classification Search ............ 174/260, 174/256, 258; 361/738, 761–766, 783
See application file for complete search history.

(56) References Cited

U.S. PATENT DOCUMENTS

| | | | | |
|---|---|---|---|---|
| 4,870,746 A | * | 10/1989 | Klaser | 29/620 |
| 4,947,531 A | * | 8/1990 | Brisson | 29/446 |
| 6,021,050 A | * | 2/2000 | Ehman et al. | 361/793 |
| 6,489,668 B1 | * | 12/2002 | Oda et al. | 257/675 |
| 6,734,542 B2 | * | 5/2004 | Nakatani et al. | 257/687 |
| 6,814,893 B2 | * | 11/2004 | Takezawa et al. | 252/512 |
| 6,818,836 B2 | | 11/2004 | Shiraishi et al. | |
| 6,872,893 B2 | | 3/2005 | Fukuoka et al. | |
| 6,889,155 B2 | * | 5/2005 | Ogino et al. | 702/113 |
| 6,906,257 B2 | * | 6/2005 | Saccomanno et al. | 174/36 |
| 7,100,276 B2 | | 9/2006 | Fukuoka et al. | |
| 2002/0117743 A1 | | 8/2002 | Nakatani et al. | |
| 2002/0189859 A1 | * | 12/2002 | Shiraishi et al. | 174/261 |
| 2002/0195420 A1 | * | 12/2002 | Obert et al. | 216/27 |
| 2004/0158980 A1 | | 8/2004 | Nakatani et al. | |
| 2005/0000725 A1 | | 1/2005 | Shiraishi et al. | |
| 2005/0186768 A1 | * | 8/2005 | Sugaya et al. | 438/597 |
| 2005/0230848 A1 | | 10/2005 | Nakatani et al. | |
| 2006/0254050 A1 | | 11/2006 | Fukuoka et al. | |

FOREIGN PATENT DOCUMENTS

| | | |
|---|---|---|
| JP | A-11-26943 | 1/1999 |
| JP | A-2000-349447 | 12/2000 |
| JP | A-2001-168491 | 6/2001 |

OTHER PUBLICATIONS

Office Action from Japan Patent Office issued on May 16, 2007 for the corresponding Japanese patent application No. 2003-101461 (a copy and English translation thereof).

* cited by examiner

*Primary Examiner*—Jeremy C Norris
(74) *Attorney, Agent, or Firm*—Posz Law Group, PLC

(57) ABSTRACT

A multi-layer printed circuit board includes: a resin substrate including a plurality of laminated thermoplastic resin films; a thin film resistor embedded in the resin substrate; and an electrode disposed on the thin film resistor. The thermoplastic resin film includes a conductive pattern made of metallic film. The electrode is covered with the conductive pattern disposed over or under the electrode.

14 Claims, 9 Drawing Sheets

MULTI-LAYER PRINTED CIRCUIT BOARD AND METHOD FOR MANUFACTURING THE SAME

CROSS REFERENCE TO RELATED APPLICATION

This application is based on Japanese Patent Application No. 2003-101461 filed on Apr. 4, 2003, the disclosure of which is incorporated herein by reference.

FIELD OF THE INVENTION

The present invention relates to a multi-layer printed circuit board and a method for manufacturing the same. The multi-layer printed circuit board includes a resin substrate and a thin film resistor embedded in the resin substrate. Multiple resin films made of thermoplastic resin are laminated and bonded each other so that the resin substrate is provided. A conductive pattern made of metallic film is disposed on the resin film.

BACKGROUND OF THE INVENTION

A multi-layer printed circuit board having a conductive pad disposed on the surface of the circuit board for mounting an electric part is, for example, disclosed in Japanese Patent Application Publication No. 2000-349447. In the multi-layer printed circuit board, a crack may be generated at a periphery of the conductive pad by a difference of thermal expansion. A proceeding of the crack is prevented by a conductive pattern embedded in an insulation resin and disposed near the periphery of the conductive pad.

In some cases, an electric part is mounted not only on the surface of the multi-layer printed circuit board but also inside of the multi-layer printed circuit board. One of the electric parts mounted inside of the circuit board is a thin film resistor formed by a sheet forming method, a paste forming method, a sputtering method or the like.

FIG. 9 shows a comparison sample of a multi-layer printed circuit board having a thin film resistor embedded in the circuit board, and is a schematic cross sectional view showing a multi-layer printed circuit board 100 having a thin film resistor 4 embedded therein.

The multi-layer printed circuit board 100 shown in FIG. 9 includes a resin substrate 1. The resin substrate 1 is formed by bonding five resin films together. The five resin films are made of thermoplastic resin, and are laminated. A conductive pattern 2 made of metallic film is formed on the resin film. One of the resin films laminated and bonded together includes the thin film resistor 4 and an electrode 5 for the thin film resistor 4. The one resin film is laminated and bonded so that the thin film resistor 4 is embedded in the resin substrate 1. Here, reference No. 3 represents a conductive material member filled in a hole disposed in the resin substrate 1. The conductive material member 3 connects the electrode 5 of the thin film resistor 4 and the conductive pattern 2.

The film thickness of the thin film resistor 4 is equal to or thinner than 10 μm. Specifically, in a case where the thin film resistor 4 is formed of a sheet of nickel (i.e., Ni) and phosphorous (i.e., P), the film thickness of the thin film resistor 4 is typically equal to or thinner than 1 μm. Therefore, the thin film resistor is extremely thin. Further, since the thin film resistor 4 is formed by a paste forming method or a sputtering method, strength of the thin film resistor 4 becomes small compared with the conductive pattern 2 made of metallic film. Therefore, when the resin films are laminated to manufacture the multi-layer printed circuit board 100, a crack 9 is easily generated in the thin film resistor 4 near the periphery of the electrode 5, as shown in FIG. 9.

SUMMARY OF THE INVENTION

In view of the above-described problem, it is an object of the present invention to provide a multi-layer printed circuit board and a method for manufacturing the same. The multi-layer printed circuit board is formed of multiple resin films laminated and bonded together. The resin films are made of thermoplastic resin, and a conductive pattern is formed on the resin film. The multi-layer printed circuit board includes a thin film resistor embedded therein. The thin film resistor is prevented from cracking in case of manufacturing the multi-layer printed circuit board. The multi-layer printed circuit board according to a preferred embodiment of the present invention includes a resin substrate formed by laminating multiple thermoplastic resin films; a thin film resistor embedded in the resin substrate; and an electrode disposed on the thin film resistor. The thermoplastic resin film includes a conductive pattern made of metallic film. The periphery of the electrode is covered with the conductive pattern disposed over or under the electrode.

In the above circuit board, the periphery of the electrode disposed on the thin film resistor is covered with the conductive pattern, which is made of strong metallic film and disposed over or under the electrode. Accordingly, when the thermoplastic resin films are bonded together by heating and pressurizing, the fluidized thermoplastic resin film is prevented by the conductive pattern from moving toward the periphery of the electrode. Therefore, stress concentration to the thin film resistor disposed near the periphery of the electrode by the fluidized thermoplastic resin film is limited, so that the thin film resistor is prevented from cracking.

Preferably, the thin film resistor is covered with the conductive pattern disposed on a side opposite to the electrode across the thin film resistor. In this case, when the thermoplastic resin films are bonded together by heating and pressurizing, the fluidized thermoplastic resin film is prevented by the conductive pattern disposed on the side opposite to the electrode from moving toward the thin film resistor. Therefore, the stress concentration to the thin film resistor by the fluidized thermoplastic resin film is limited, so that the thin film resistor is prevented from cracking.

Preferably, when the thermoplastic resin composing the thermoplastic resin film is fluidized, the conductive pattern prevents the fluidized thermoplastic resin from moving toward the thin film resistor.

Further, another multi-layer printed circuit board according to another preferred embodiment of the present invention includes a resin substrate formed by laminating multiple thermoplastic resin films; a thin film resistor embedded in the resin substrate. The thermoplastic resin film includes a conductive pattern made of metallic film and disposed on the surface of the resin film. The resin substrate has a hole filled with a conductive material. The thin film resistor is directly connected to the conductive pattern disposed over or under the thin film resistor through the conductive material in the hole.

In this case, the thin film resistor is directly connected to the conductive pattern disposed over or under the thin film resistor through the conductive material filled in the hole of the resin substrate without forming an electrode. Accordingly, when the thermoplastic resin films are bonded together by heating and pressurizing, local stress concentration to the thin film resistor by the fluidized thermoplastic resin film is limited. That is because the circuit board has no electrode, which triggers the local stress on the thin film resistor. Thus, the thin film resistor is prevented from cracking.

Preferably, the thin film resistor is covered with the conductive pattern disposed over or under the electrode. In this case, when the thermoplastic resin films are bonded together by heating and pressurizing, the fluidized thermoplastic resin film is prevented by the conductive pattern for covering the thin film resistor disposed over or under the electrode from moving toward the thin film resistor. The conductive pattern is made of strong metallic film. Thus, the stress concentration to the thin film resistor by the fluidized thermoplastic resin film is limited, so that the thin film resistor is prevented from cracking.

Further, a method for manufacturing a multi-layer printed circuit board according to the preferred embodiment of the present invention includes the steps of: preparing a conductive pattern film by forming a predetermined conductive pattern made of metallic film on a thermoplastic resin film; preparing a thin film resistor film with an electrode by forming a thin film resistor on the thermoplastic resin film and by forming the electrode on the thin film resistor; laminating the conductive pattern film on the thin film resistor film with the electrode in order to cover the periphery of the electrode with the conductive pattern disposed over or under the electrode; and bonding the conductive pattern film and the thin film resistor film with the electrode by heating and pressurizing the laminates of the conductive pattern film and the thin film resistor film with the electrode.

In the above circuit board, the periphery of the electrode disposed on the thin film resistor is covered with the conductive pattern, which is made of strong metallic film and disposed over or under the electrode. Accordingly, when the thermoplastic resin films are bonded together by heating and pressurizing, the fluidized thermoplastic resin film is prevented by the conductive pattern from moving toward the periphery of the electrode. Therefore, stress concentration to the thin film resistor disposed near the periphery of the electrode by the fluidized thermoplastic resin film is limited, so that the thin film resistor is prevented from cracking. Further, the resin film having the conductive pattern and the thin film resistor film having the thin film resistor are bonded together at the same time by heating and pressurizing. Therefore, the multi-layer printed circuit board manufactured by the above method includes the conductive patterns made of metallic film and formed into a multi-layered construction. The circuit board further includes the thin film resistor embedded in the resin substrate. The circuit board is manufactured at a low cost.

Preferably, when the thermoplastic resin composing the thermoplastic resin film is fluidized in a bonding process for bonding the conductive pattern film and the thin film resistor film with the electrode, the conductive pattern prevents the fluidized thermoplastic resin from moving toward the thin film resistor.

Furthermore, another method for manufacturing a multi-layer printed circuit board according to the other preferred embodiment of the present invention includes the steps of: preparing a conductive pattern film by forming a predetermined conductive pattern made of metallic film on a thermoplastic resin film; filling a hole having a bottom with a conductive material, the hole being formed in the conductive pattern film to have the bottom of the conductive pattern; preparing a thin film resistor film by forming a thin film resistor on the thermoplastic resin film; laminating the conductive pattern film on the thin film resistor film in order to connect directly the thin film resistor to the conductive pattern through the conductive material filled in the hole with the bottom, which is provided by the conductive pattern disposed over or under the thin film resistor; and bonding the conductive pattern film and the thin film resistor film by heating and pressurizing the laminates of the conductive pattern film and the thin film resistor film.

In this case, the thin film resistor is directly connected to the conductive pattern disposed over or under the thin film resistor through the conductive material filled in the hole of the resin substrate without forming an electrode. Accordingly, when the thermoplastic resin films are bonded together by heating and pressurizing, local stress concentration to the thin film resistor by the fluidized thermoplastic resin film is limited. That is because the circuit board has no electrode, which triggers the local stress on the thin film resistor. Thus, the thin film resistor is prevented from cracking. Further, the resin film having the conductive pattern and the thin film resistor film having the thin film resistor are bonded together at the same time by heating and pressurizing. Therefore, the multi-layer printed circuit board manufactured by the above method includes the conductive patterns made of metallic film and formed into a multi-layered construction. The circuit board further includes the thin film resistor embedded in the resin substrate. The circuit board is manufactured at a low cost.

DETAILED DESCRIPTION OF THE PREFERRED EMBODIMENTS

A multi-layer printed circuit board and method for manufacturing the circuit board according to the present invention are explained with reference to the drawings as follows.

Figure 1A:
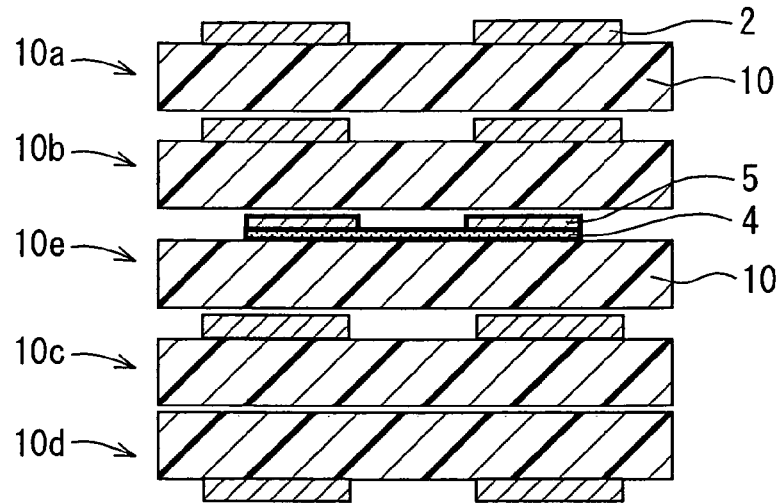
FIGS. 1A-1C are cross sectional views showing a multi-layer printed circuit board, and explaining principle and effect of the present invention.
Figure 1B:
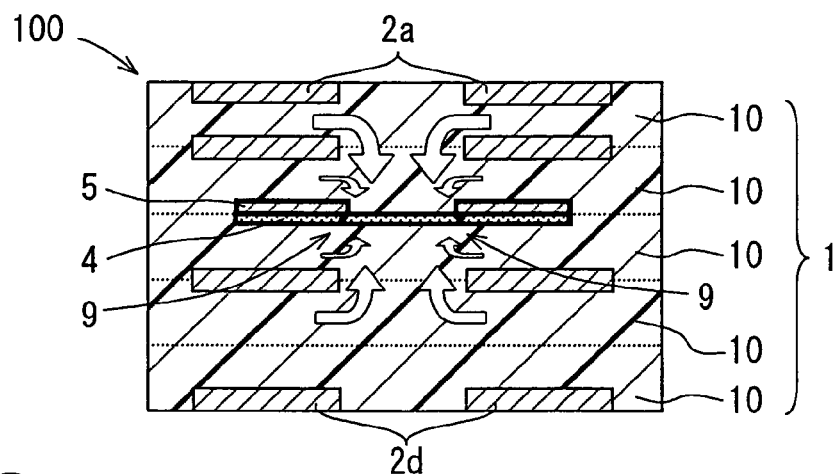
Figure 1C:
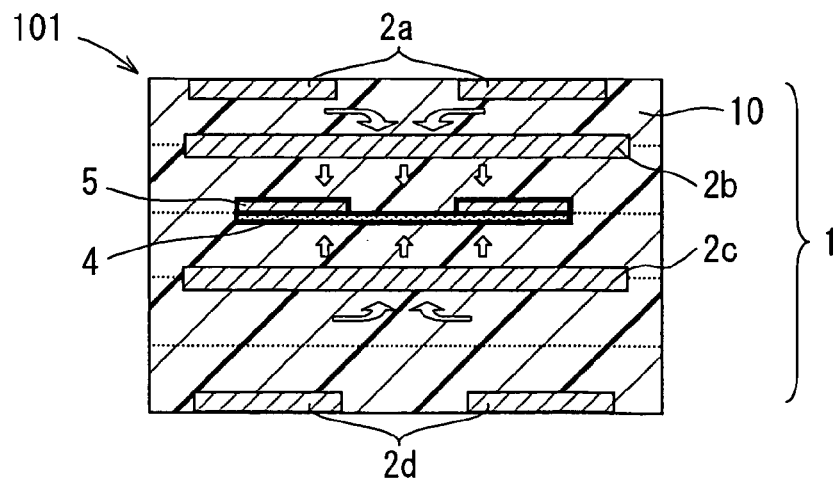

FIGS. 1A-1C explain principle and effect of the multi-layer printed circuit board according to the present invention. In FIGS. 1A-1C, a conductive material member 3 is omitted to describe from the drawings for simplification.

FIG. 1A is a schematic cross sectional view showing a laminated arrangement of conductive pattern films 10a-10d and a thin film resistor film 10e with an electrode 5 composing a multi-layer printed circuit board 101 before bonding. Each conductive pattern film 10a-10d is includes a resin film 10 made of thermoplastic resin and a predetermined conductive pattern 2 made of metallic film such as a copper foil and disposed on the resin film 10. The thin film resistor film 10e with the electrode 5 includes the resin film 10 made of thermoplastic resin, a thin film resistor 4 formed on the resin film 10, and an electrode 5 formed on the thin film resistor 4.

FIG. 1B shows a state of a heated and pressurized laminates shown in FIG. 1A heated and pressurized by a hot press plate (not shown). The resin film 10 made of thermoplastic resin is softened by heating so that the resin film 10 is capable of being fluidized. The conductive pattern made of metallic film is embedded in the resin films 10 by pressurizing. Therefore, a part of the thermoplastic resin disposed under the conductive patterns 2a, 2d is extruded to the outside, so that the part of the thermoplastic resin is fluidized as shown outlined arrows in FIG. 1B. Thus, the thermoplastic resin moves toward the thin film resistor 4 and the electrode 5, so that the thermoplastic resin generates stress against the thin film resistor 4 and the electrode 5. Specifically, the stress is most concentrated at a periphery of the electrode 5, so that a crack 9 may be generated at a portion of the thin film resistor 4 disposed near the periphery of the electrode 5.

FIG. 1C shows a state of a heated and pressurized multi-layer printed circuit board 101 according to the present invention. In the multi-layer printed circuit board 101 shown in FIG. 1C, the thin film resistor 4 and the electrode 5 are covered with the conductive patterns 2b, 2c made of strong metallic film and disposed over and under the thin film resistor 4 and the electrode 5, respectively. Therefore, the part of the thermoplastic resin extruded outside by embedding the conductive patterns 2a, 2d in case of pressurizing is prevented by the conductive patterns 2b, 2c from moving toward the thin film resistor 4 and the electrode 5. Accordingly, the stress applied to the thin film resistor 4 and the electrode 5 becomes small, so that the thin film resistor 4 is protected from cracking.

Next, the multi-layer printed circuit board and the method for manufacturing the circuit board according to the present invention is described in detail. Specifically, a construction around the thin film resistor of the circuit board is described as follows.

First Embodiment

Figure 2A:
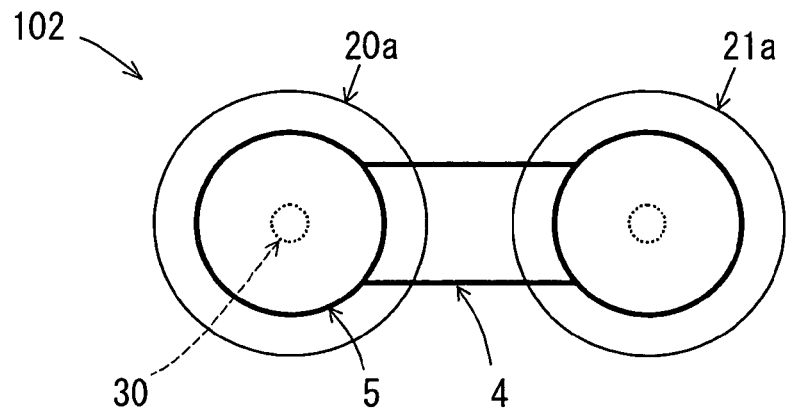
FIG. 2A is a top view.
Figure 2B:
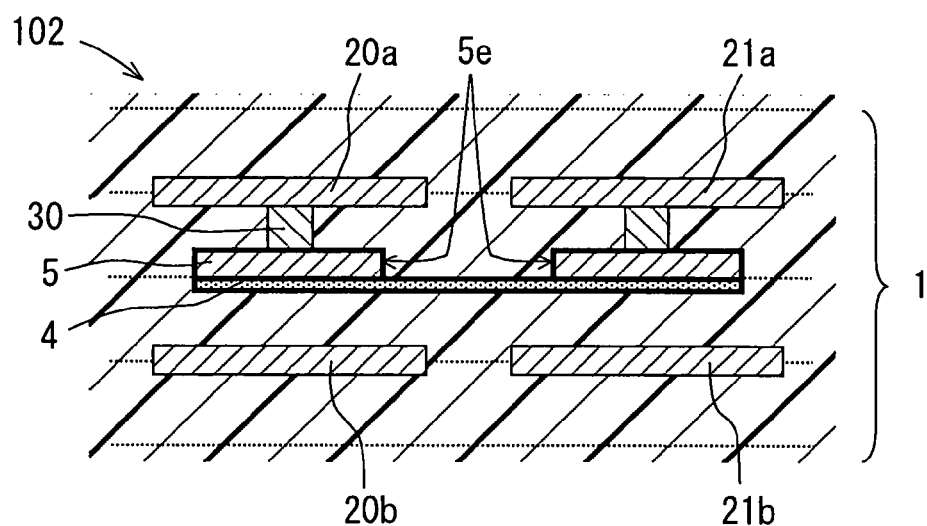
FIG. 2B is a cross sectional view.
Figure 2C:
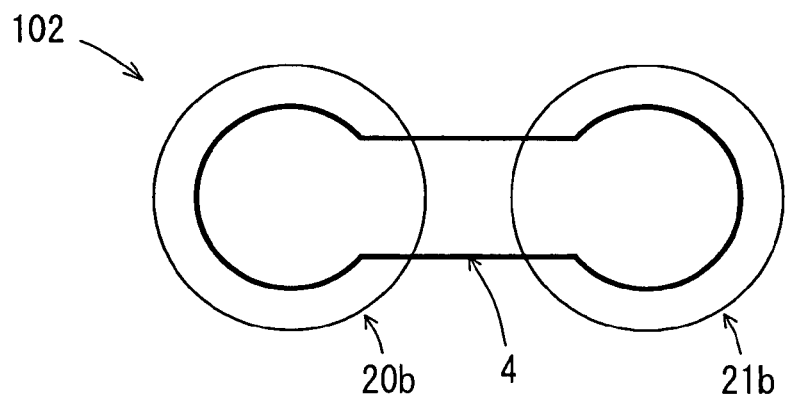
FIG. 2C is a bottom view showing a construction around a thin film resistor of a multi-layer printed circuit board according to a first embodiment of the present invention.

FIGS. 2A-2C are schematic views showing a construction around a thin film resistor of a multi-layer printed circuit board 102 according to a first embodiment of the present invention. Here, reference No. 30 represents a conductive material member filled in a hole disposed in the resin substrate 1. The conductive material member 30 connects the electrode 5 of the thin film resistor 4 and the conductive patterns 20a, 21a.

The multi-layer printed circuit board 102 shown in FIGS. 2A-2C includes the resin substrate 1 made of thermoplastic resin and the thin film resistor 4 embedded in the resin substrate 1. The electrode 5 is formed on the thin film resistor 4. Further, a periphery 5e of the electrode 5 is covered with the conductive patterns 20a, 20b, 21a, 21b disposed over and under the electrode 5. The conductive patterns 20a, 20b, 21a, 21b are made of metallic film.

Accordingly, as explained above with reference to FIG. 1C, when the thermoplastic resin films are bonded together by heating and pressurizing, the fluidized thermoplastic resin is prevented by the conductive patterns 20a, 20b, 21a, 21b from moving toward the periphery 5e of the electrode 5. Therefore, stress concentration to the thin film resistor 4 disposed near the periphery 5e of the electrode 5 by the fluidized thermoplastic resin film is limited, so that the thin film resistor 4 is prevented from cracking.

Figure 3A:
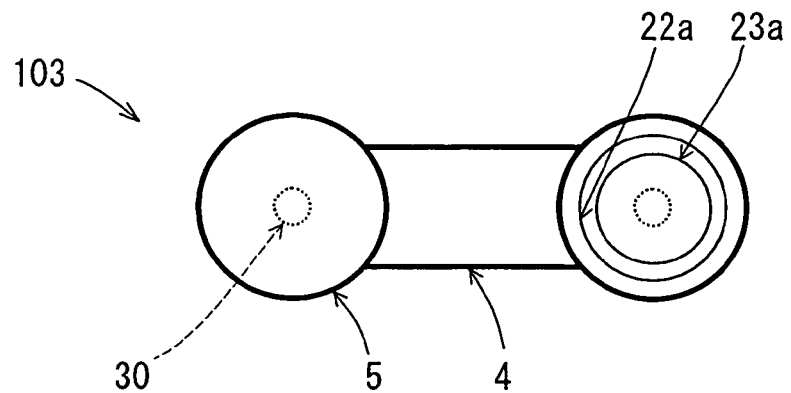
FIG. 3A is a top view.
Figure 3B:
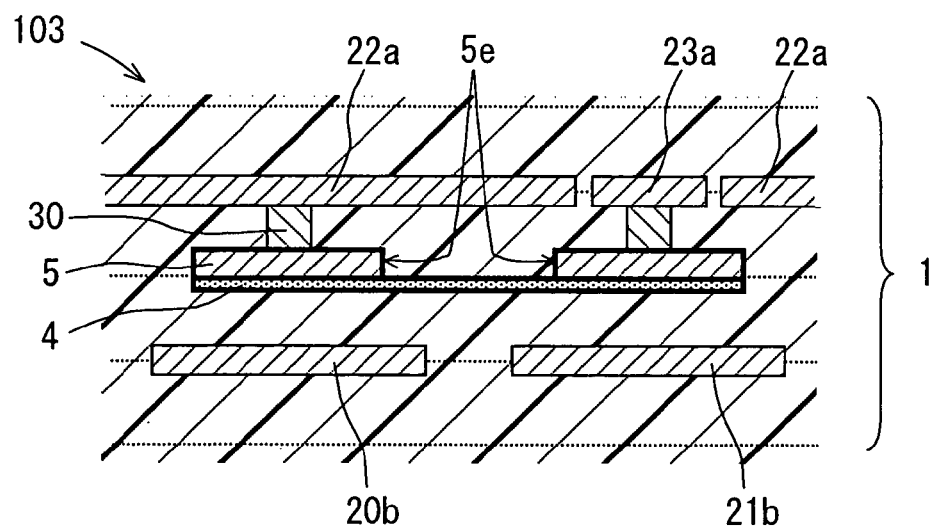
FIG. 3B is a cross sectional view.
Figure 3C:
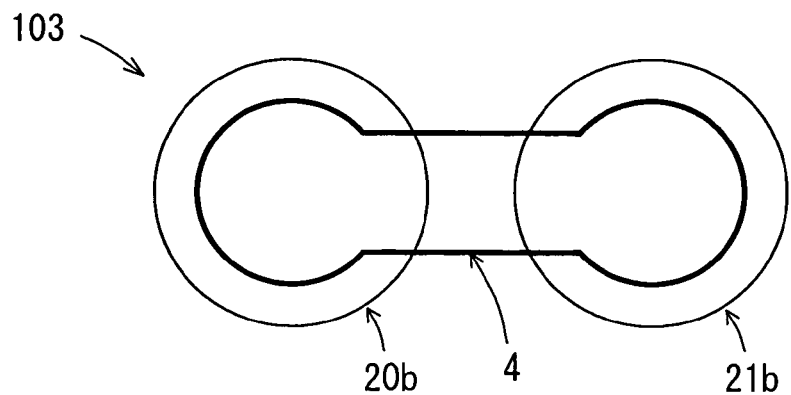
FIG. 3C is a bottom view showing a construction around a thin film resistor of another multi-layer printed circuit board according to the first embodiment.

FIGS. 3A-3C are schematic views showing a construction around a thin film resistor of another multi-layer printed circuit board 103. The multi-layer printed circuit board 103 shown in FIGS. 3A-3C has the periphery 5e of the electrode 5 disposed on the thin film resistor 4 and covered with a wide conductive pattern 22a disposed over the electrode 5, that is different from the multi-layer printed circuit board 102 shown in FIGS. 2A-2C. However, in this case, the fluidized thermoplastic resin is prevented by the conductive patterns 22a, 20b, 21b from moving toward the periphery 5e of the electrode 5. Therefore, stress concentration to the thin film resistor 4 disposed near the periphery 5e of the electrode 5 by the fluidized thermoplastic resin film is limited, so that the thin film resistor 4 is prevented from cracking.

Figure 4A:
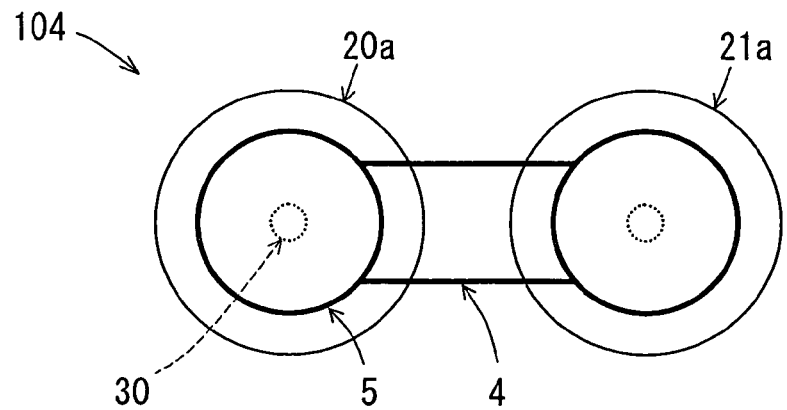
FIG. 4A is a top view.
Figure 4B:
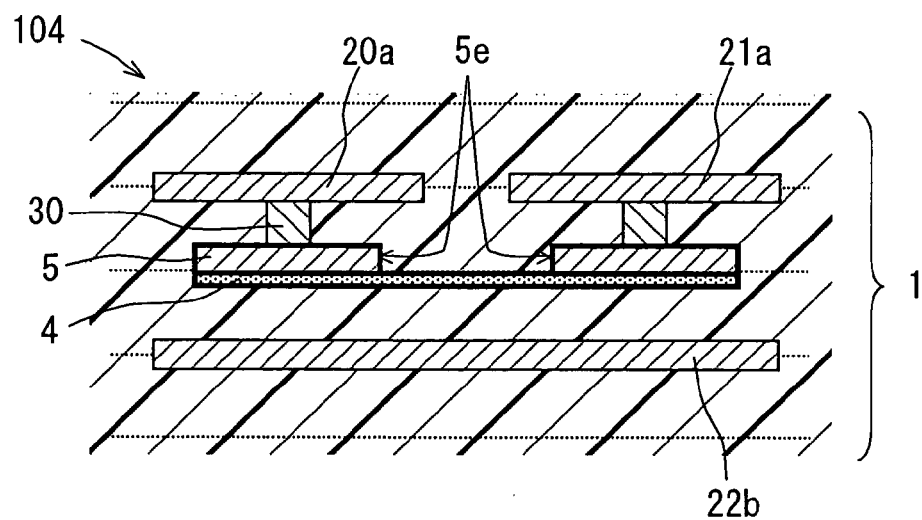
FIG. 4B is a cross sectional view.
Figure 4C:
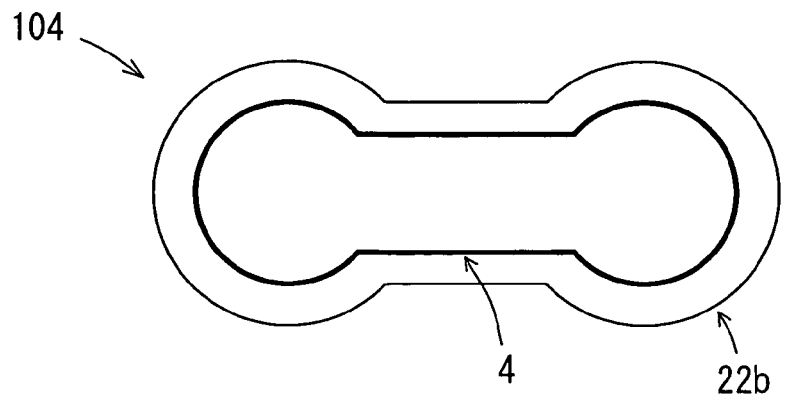
FIG. 4C is a bottom view showing a construction around a thin film resistor of further another multi-layer printed circuit board according to the first embodiment.

FIGS. 4A-4C are schematic views showing a construction around a thin film resistor of further another multi-layer printed circuit board 104. In the multi-layer printed circuit board 104 shown in FIGS. 4A-4C, not only the periphery 5e of the electrode 5 but also the whole thin film resistor 4 are covered with a conductive pattern 22b disposed over the electrode 5 and disposed on a side opposite to the electrode 5 across the thin film resistor 4. Accordingly, in this case, the fluidized thermoplastic resin disposed under the thin film resistor 4 is completely prevented by the conductive pattern 22b from moving toward the thin film resistor 4. Therefore, stress concentration to the thin film resistor 4 by the fluidized thermoplastic resin film is limited, so that the thin film resistor 4 is prevented from cracking.

Next, a method for manufacturing the multi-layer printed circuit board 102 as an example is described as follows.

FIGS. 5A-5D are cross sectional views in each process of a method for manufacturing the multi-layer printed circuit board 102.

Figure 5A:
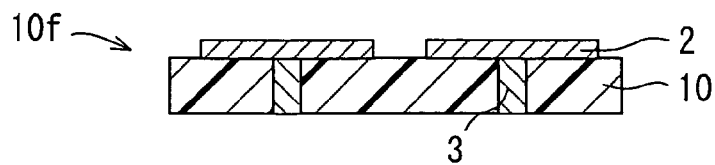
FIGS. 5A-5D are cross sectional views explaining a method for manufacturing the multi-layer printed circuit board according to the first embodiment.

At first, as shown in FIG. 5A, a conductive pattern film 10f is prepared in such a manner that a predetermined conductive pattern 2 made of metallic film is formed on the resin film 10 made of thermoplastic resin. Here, the conductive pattern film 10f may include a hole with a bottom, which is provided by the conductive pattern 2, if necessary. The conductive material 3 is filled in the hole with the bottom.

Figure 5B:
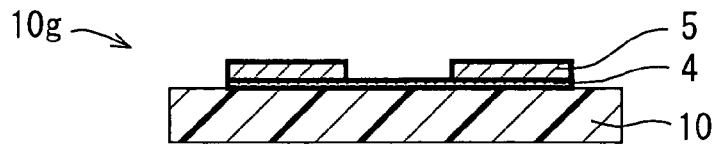

As shown in FIG. 5B, a thin film resistor film 10g with an electrode 5 is prepared in such a manner that the thin film resistor 4 is formed on the resin film 10 made of thermoplastic resin, and the electrode 5 is formed on the thin film resistor 4.

Figure 5C:
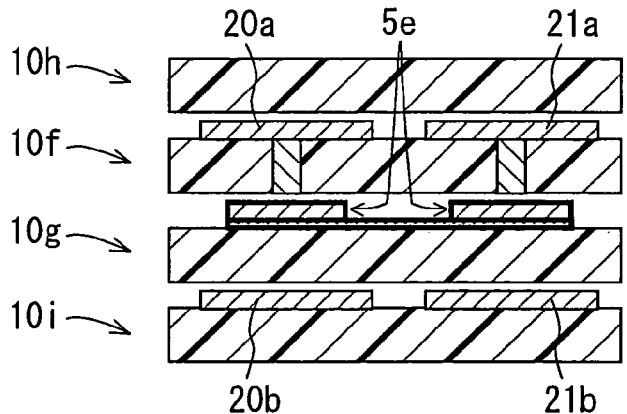

Next, as shown in FIG. 5C, the conductive pattern films 10f, 10h, 10i and the thin film resistor film 10g with the electrode 5 are laminated in such a manner that the periphery 5e of the electrode 5 in the thin film resistor film 10g with the electrode 5 is covered with the conductive patterns 20a, 20b, 21a, 21b disposed over and under the electrode 5.

Figure 5D:
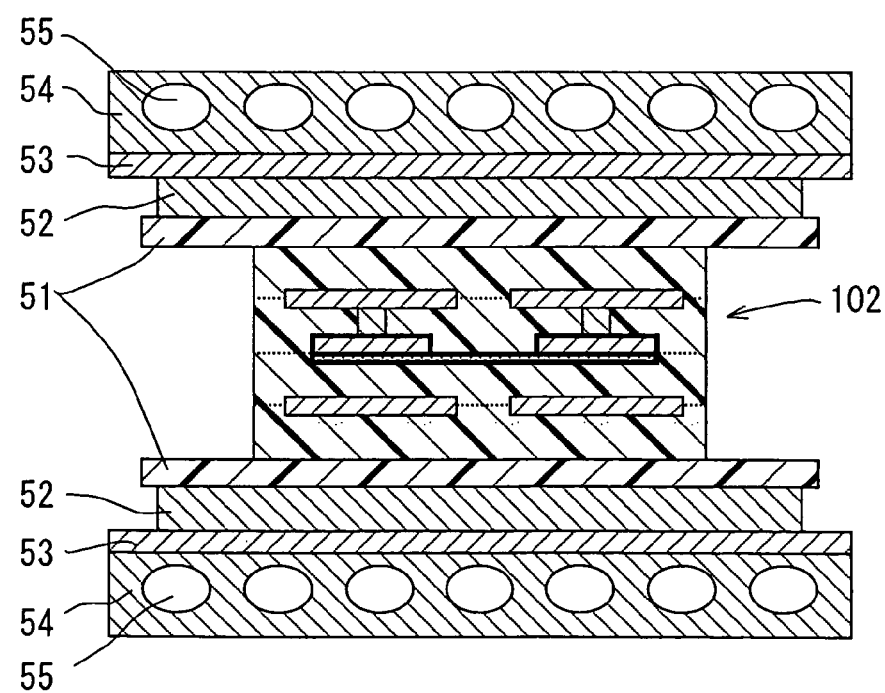

Next, as shown in FIG. 5D, the laminates of the conductive pattern films 10f, 10h, 10i and the thin film resistor film 10g with the electrode 5 are inserted between a pair of hot press plates 54 through an adhesion protection film 51, a buffer 52 and a metal plate 53. A heater 55 is embedded in the hot press plates 54. Then, the laminates are heated and pressurized by the hot press plates 54 so that the conductive pattern films 10f, 10h, 10i and the thin film resistor film 10g with the electrode 5 are integrally bonded together.

Here, the adhesion protection film 51 shown in FIG. 5D prevents the resin film 10 from adhering to other parts disposed near the resin film 10 in case of heating and pressurizing, and protects the resin film 10 and the conductive pattern 2 from being damaged. The adhesion protection film 51 is made of, for example, poly-imide film or the like. The buffer 52 works for pressurizing the laminated conductive pattern films 10f, 10g, 10h, 10i uniformly. The buffer 52 is made of, for example, fibrous metal, which is formed by cutting a metal such as stainless steel and the like. The metal plate 53 prevents the hot press plate 54 from being damaged. The metal plate 53 is made of, for example, stainless steel (i.e., SUS), titanium (i.e., Ti) or the like.

Thus, the heated and pressurized laminated multi-layer printed circuit board is retrieved from the hot press plate 54, so that the multi-layer printed circuit board 102 shown in FIGS. 2A-2C is completed.

In the above method for manufacturing the multi-layer printed circuit board 102 shown in FIGS. 5A-5D, since the conductive pattern films 10f, 10h, 10i and the thin film resistor film 10g with the electrode 5 are bonded together at the same time by heating and pressurizing. Accordingly, the multi-layer printed circuit board 102 including the resin substrate 1 with the thin film resistor embedded therein by forming the conductive patterns 2 made of metallic film into a multi-layered construction is manufactured at a low cost. Here, both of the multi-layer printed circuit board 103 shown in FIGS. 3A-3C and the multi-layer printed circuit board 104 shown in FIGS. 4A-4C are also manufactured by the similar manufacturing method shown in FIG. 5A-5D.

Second Embodiment

In the multi-layer printed circuit board 101-104 according to the first embodiment of the present invention, the electrode 5 is formed on the thin film resistor 4 embedded in the resin substrate 1. In a multi-layer printed circuit board according to a second embodiment of the present invention, the circuit board includes the thin film resistor 4 with no electrode embedded in the resin substrate 1.

Figure 6A:
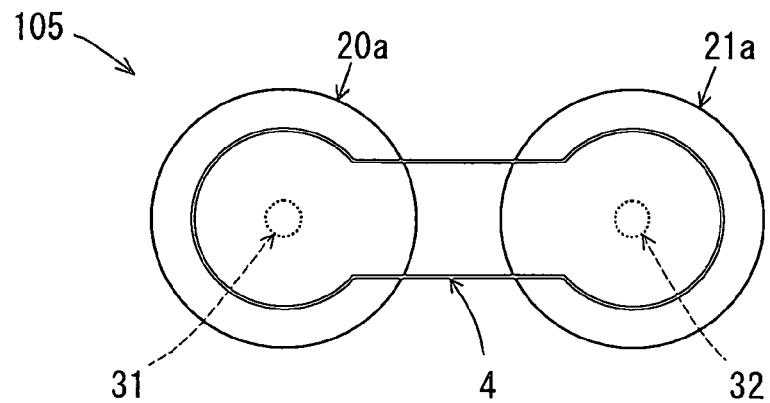
FIG. 6A is a top view.
Figure 6B:
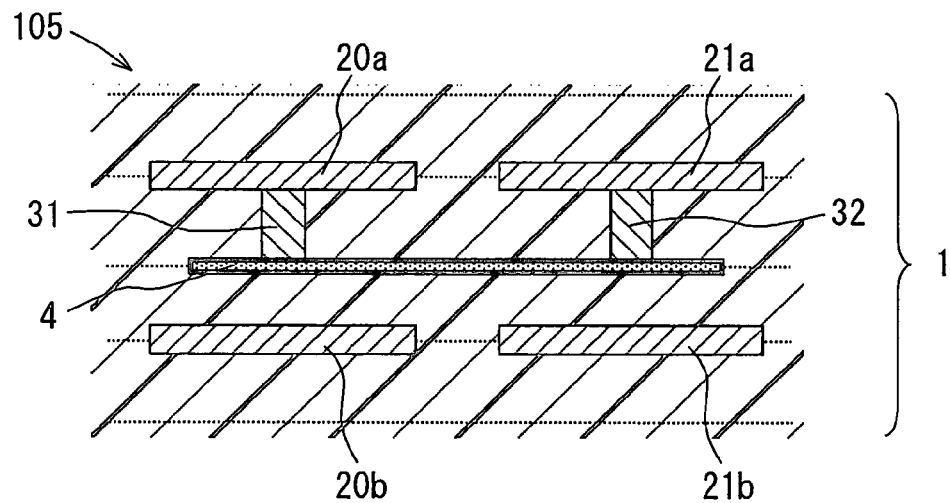
FIG. 6B is a cross sectional view.
Figure 6C:
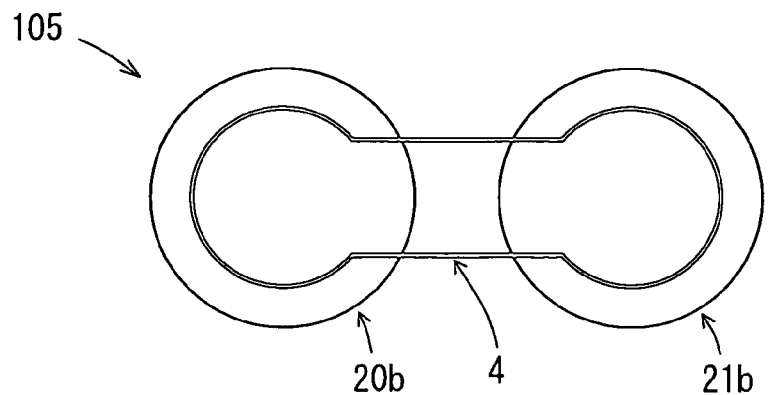
FIG. 6C is a bottom view showing a construction around a thin film resistor of a multi-layer printed circuit board according to a second embodiment of the present invention.

FIGS. 6A-6C are schematic views showing a construction around a thin film resistor of a multi-layer printed circuit board 105 according to the second embodiment. Here, references No. 31 and 32 represent a conductive material member filled in a hole disposed in the resin substrate 1. The conductive material members 31, 32 connect the thin film resistor 4 and the conductive patterns 20a, 21a, respectively.

The multi-layer printed circuit board 105 shown in FIGS. 6A-6C includes the resin substrate 1 made of thermoplastic resin and the thin film resistor 4 embedded in the resin substrate 1. However, no electrode is formed on the thin film resistor 4. Accordingly, the thin film resistor 4 shown in FIGS. 6A-6C is directly connected to the conductive patterns 20a, 21a disposed over the resistor 4 through the conductive material members 31, 32 filled in the holes of the resin substrate 1, respectively.

Thus, when the thermoplastic resin films are bonded together by heating and pressurizing, the resin substrate 1 has no electrode, which triggers a local stress on the thin film resistor 4, as described in FIG. 1C. Thus, the local stress concentration to the thin film resistor 4 by the fluidized thermoplastic resin film is limited, so that the thin film resistor 4 is prevented from cracking.

Figure 7A:
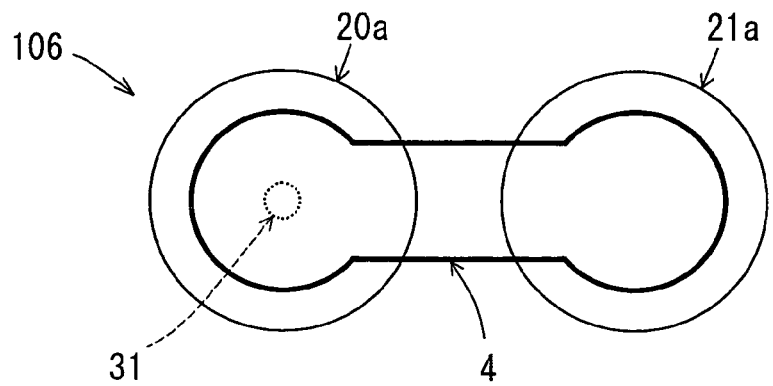
FIG. 7A is a top view.
Figure 7B:
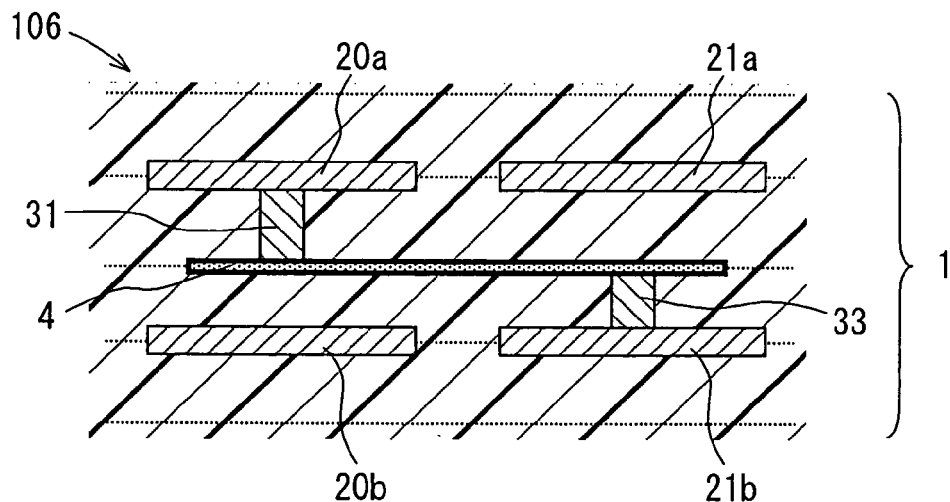
FIG. 7B is a cross sectional view.
Figure 7C:
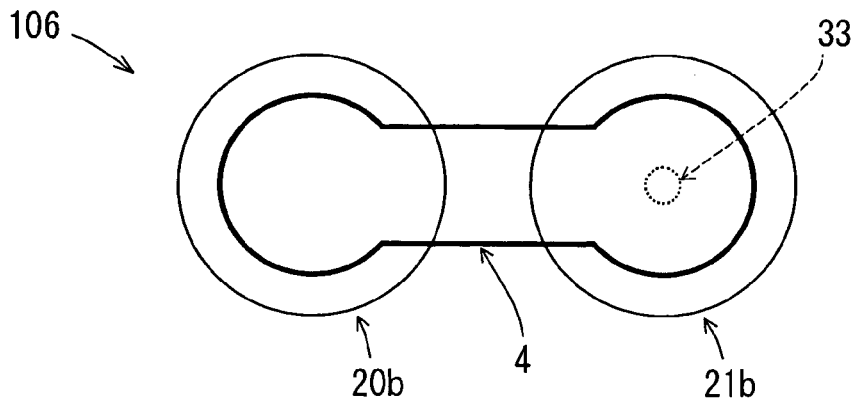
FIG. 7C is a bottom view showing a construction around a thin film resistor of another multi-layer printed circuit board according to the second embodiment.

FIGS. 7A-7C are schematic views showing a construction around a thin film resistor of another multi-layer printed circuit board 106. In the multi-layer printed circuit board 106 shown in FIGS. 7A-7C, the thin film resistor 4 is directly connected to both of the conductive pattern 20a disposed over the resistor 4 and the conductive pattern 21b disposed under the resistor 4 through the conductive material members 31, 33 filled in the hole of the resin substrate 1, respectively. In the multi-layer printed circuit board 105 shown in FIG. 7A-7C, no electrode 5 is formed on the thin film resistor 4. Accordingly, the local stress concentration to the thin film resistor 4 by the fluidized thermoplastic resin film is limited, so that the thin film resistor 4 is prevented from cracking.

Figure 8A:
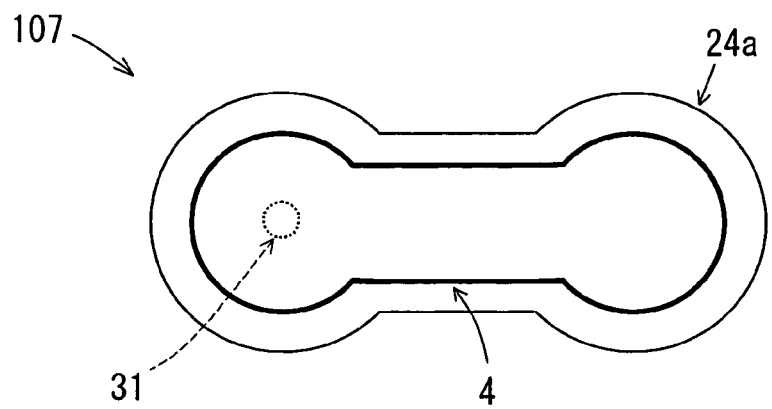
FIG. 8A is a top view.
Figure 8B:
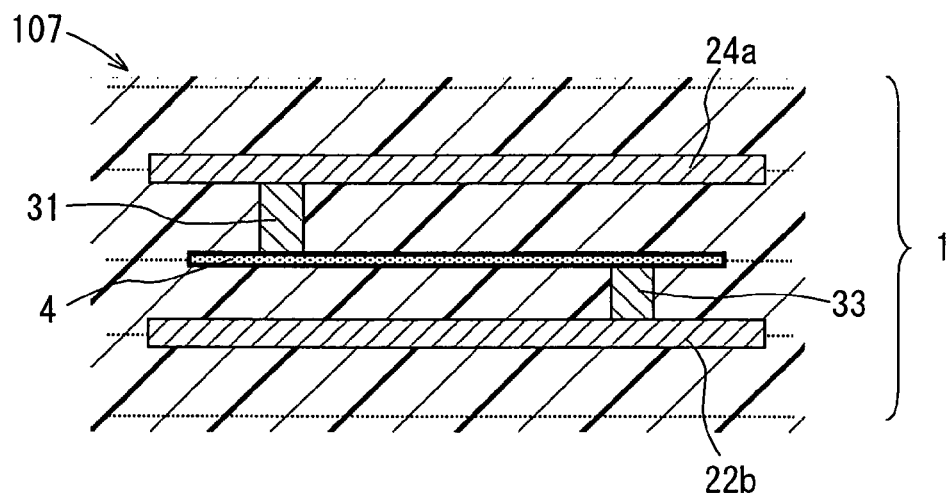
FIG. 8B is a cross sectional view.
Figure 8C:
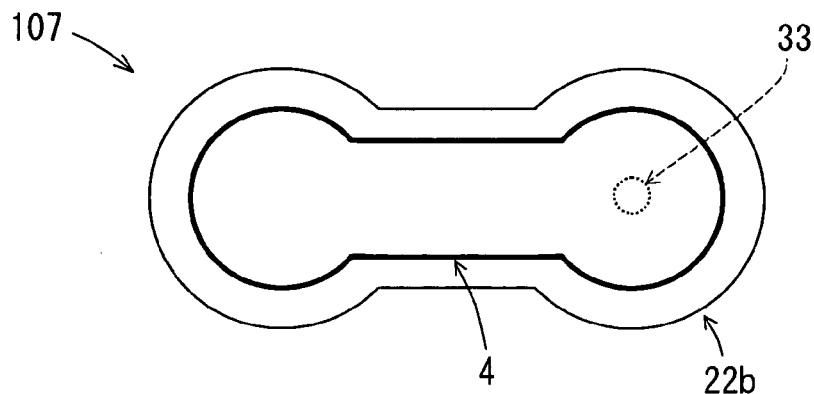
FIG. 8C is a bottom view showing a construction around a thin film resistor of further another multi-layer printed circuit board according to the second embodiment.
Figure 9:
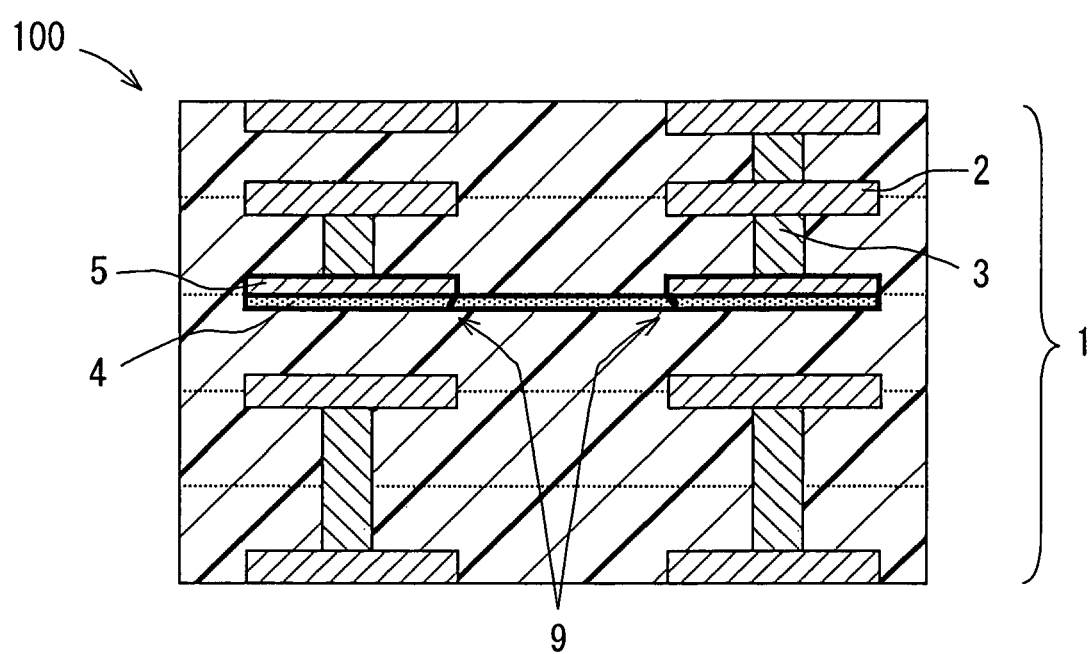
FIG. 9 is a cross sectional view showing a multi-layer printed circuit board having a thin film resistor embedded therein.

FIGS. 8A-8C are schematic views showing a construction around a thin film resistor of further another multi-layer printed circuit board 107. In the multi-layer printed circuit board 107 shown in FIGS. 8A-8C, the thin film resistor 4 is directly connected to both of the conductive patterns 24a, 22b through the conductive material members 31, 33, respectively, and moreover, the whole thin film resistor 4 is covered with both of the conductive pattern 24a disposed over the resistor 4 and the conductive pattern 22b disposed under the resistor 4. Accordingly, in this case, the fluidized thermoplastic resin is completely prevented by both of the conductive pattern 24a disposed over the resistor 4 and the conductive pattern 22b disposed under the resistor 4 from moving toward the thin film resistor 4. Therefore, stress concentration to the thin film resistor 4 by the fluidized thermoplastic resin film is limited, so that the thin film resistor 4 is prevented from cracking.

The multi-layer printed circuit board 105 shown in FIGS. 6A-6C, the multi-layer printed circuit board 106 shown in FIGS. 7A-7C, and the multi-layer printed circuit board 107 shown in FIGS. 8A-8C, are also manufactured by the similar manufacturing method shown in FIG. 5A-5D. Here, in the manufacturing process for manufacturing the multi-layer printed circuit boards 105-107 according to the second embodiment, a thin film resistor film without electrode 5 disposed on the thin film resistor 4 is prepared such that the thin film resistor 4 is formed on the resin film 10 made of thermoplastic resin in the process shown in FIG. 5B. Further, in case of the multi-layer printed circuit boards 106, 107, a hole with a bottom is also formed in the thin film resistor film, and the conductive material is filled in the hole with the bottom, which is provided by the thin film resistor 4. This is different from the method shown in FIGS. 5A-5D.

Other Embodiments

In the circuit board 101-104 according to the first embodiment, the conductive patterns are disposed over and under the thin film resistor 4 for covering the periphery of the electrode. Further, in the circuit board 105-107 according to the second embodiment, the conductive patterns directly connected to the resistor 4 through the conductive material member are disposed over and under the thin film resistor 4. However, the conductive pattern for covering the periphery of the electrode or directly connected to the resistor through the conductive material member can be disposed on one side of the thin film resistor 4 so that no conductive pattern is disposed on the other side of the resistor 4. Further, in a case where the conductive pattern is disposed on the other side of the resistor and the conductive pattern is apart from the thin film resistor 4, the conductive pattern for covering the periphery of the electrode or directly connected to the resistor through the conductive material member can be effective even when the conductive pattern is disposed on the one side of the thin film resistor 4.

What is claimed is:

1. A multi-layer printed circuit board comprising:
a resin substrate including a plurality of laminated thermoplastic resin films;
a thin film resistor embedded in the resin substrate; and
an electrode disposed on the thin film resistor,
wherein the thermoplastic resin film includes a conductive pattern made of metallic film, and
wherein the conductive pattern is disposed over or under the electrode, the conductive pattern is disposed nearer to the electrode than any other conductive pattern over or under the electrode, and the conductive pattern covers all of a periphery of the electrode,
wherein all of a periphery of the thin film resistor is covered with the conductive pattern disposed over or under the resistor.

2. The multi-layer printed circuit board according to claim 1,
wherein the thin film resistor is covered with the conductive pattern disposed on a side opposite to the electrode across the thin film resistor.

3. The multi-layer printed circuit board according to claim 1,
wherein the thin film resistor has a thickness equal to or thinner than 10 μm.

4. The multi-layer printed circuit board according to claim 3,
wherein the thin film resistor has the thickness equal to or thinner than 1 μm.

5. The multi-layer printed circuit board according to claim 1,
wherein the resin substrate includes a plurality of thermoplastic resin films laminated and bonded together.

6. The multi-layer printed circuit board according to claim 1,
wherein the conductive pattern prevents a fluidized thermoplastic resin from moving toward the thin film resistor when a thermoplastic resin composing the thermoplastic resin film is fluidized.

7. A multi-layer printed circuit board comprising:
a resin substrate including a plurality of laminated thermoplastic resin films; and
a thin film resistor embedded in the resin substrate,
wherein the thermoplastic resin film includes a conductive pattern, which is disposed on a surface of the resin film and made of metallic film,
wherein the resin substrate includes a hole filled with a conductive material,
wherein the thin film resistor is directly connected to the conductive pattern through the conductive material in the hole, the conductive pattern being disposed over or under the resistor, the conductive pattern being disposed nearer to the thin film resistor than any other conductive pattern over or under the resistor, and
wherein all of a periphery of the thin film resistor is covered with the conductive pattern.

8. The multilayer printed circuit board according to claim 7,
wherein the thin film resistor is covered with the conductive pattern disposed over or under the resistor.

9. The multi-layer printed circuit board according to claim 7,
wherein the thin film resistor has a thickness equal to or thinner than 10 μm.

10. The multi-layer printed circuit board according to claim 9,
wherein the thin film resistor has the thickness equal to or thinner than 1 μm.

11. The multi-layer printed circuit board according to claim 7,
wherein the resin substrate includes a plurality of thermoplastic resin films laminated and bonded together.

12. The multi-layer printed circuit board according to claim 7,
wherein the conductive pattern prevents a fluidized thermoplastic resin from moving toward the thin film resistor when a thermoplastic resin composing the thermoplastic resin film is fluidized.

13. A multi-layer printed circuit board comprising:
a resin substrate including a plurality of laminated thermoplastic resin films;
a thin film resistor embedded in the resin substrate; and
an electrode disposed on the thin film resistor,
wherein the thermoplastic resin film includes a conductive pattern made of metallic film, and
wherein the conductive pattern is disposed over or under the electrode, the conductive pattern is disposed nearer to the electrode than any other conductive pattern over or under the electrode, and the conductive pattern covers all of a periphery of the electrode;
wherein the thin film resistor is covered with the conductive pattern disposed on a side opposite to the electrode across the thin film resistor.

14. A multi-layer printed circuit board comprising:
a resin substrate including a plurality of laminated thermoplastic resin films;
a thin film resistor embedded in the resin substrate; and
an electrode disposed on the thin film resistor,
wherein the thermoplastic resin film includes a conductive pattern made of metallic film, and
wherein the conductive pattern is disposed over or under the electrode, the conductive pattern is disposed nearer to the electrode than any other conductive pattern over or under the electrode, and the conductive pattern covers all of a periphery of the electrode;
wherein the conductive pattern prevents a fluidized thermoplastic resin from moving toward the thin film resistor when a thermoplastic resin composing the thermoplastic resin film is fluidized.

* * * * *